United States Patent
Chu

(10) Patent No.: US 9,813,059 B2
(45) Date of Patent: Nov. 7, 2017

(54) CAPACITIVE SENSITIVE KEY STRUCTURE

(71) Applicant: Ching-Hsiung Chu, Taipei (TW)

(72) Inventor: Ching-Hsiung Chu, Taipei (TW)

( * ) Notice: Subject to any disclaimer, the term of this patent is extended or adjusted under 35 U.S.C. 154(b) by 0 days.

(21) Appl. No.: 15/391,855

(22) Filed: Dec. 28, 2016

(65) Prior Publication Data
US 2017/0111044 A1 Apr. 20, 2017

Related U.S. Application Data

(63) Continuation-in-part of application No. 14/827,283, filed on Aug. 15, 2015.

(51) Int. Cl.
| | |
|---|---|
| *H03K 17/94* | (2006.01) |
| *H03K 17/96* | (2006.01) |
| *G06F 3/01* | (2006.01) |
| *G06F 3/02* | (2006.01) |
| *H01H 13/803* | (2006.01) |

(52) U.S. Cl.
CPC ......... *H03K 17/9622* (2013.01); *G06F 3/016* (2013.01); *G06F 3/0202* (2013.01); *H01H 13/803* (2013.01); *H01H 2203/028* (2013.01); *H01H 2215/004* (2013.01); *H01H 2219/036* (2013.01); *H01H 2221/004* (2013.01); *H01H 2221/07* (2013.01); *H01H 2239/006* (2013.01); *H03K 2217/96046* (2013.01)

(58) Field of Classification Search
None
See application file for complete search history.

(56) References Cited

U.S. PATENT DOCUMENTS

| | | | | |
|---|---|---|---|---|
| 3,668,698 A | * | 6/1972 | Demirdjioghlou .. | H03K 17/975 307/116 |
| 4,078,257 A | * | 3/1978 | Bagley ................. | G06F 3/0238 200/5 R |
| 4,092,640 A | * | 5/1978 | Satoh ..................... | H03K 17/98 257/678 |
| 5,467,080 A | * | 11/1995 | Stoll ..................... | G07C 9/0069 340/5.54 |
| 6,037,882 A | * | 3/2000 | Levy ...................... | G06F 3/011 340/11.1 |
| 6,956,561 B2 | * | 10/2005 | Han ...................... | H01H 13/702 178/18.11 |
| 8,154,527 B2 | * | 4/2012 | Ciesla ................. | G06F 3/04886 178/18.01 |

(Continued)

*Primary Examiner* — Curtis King

(57) ABSTRACT

A capacitive sensitive key structure includes a key, support component, fixing pad, substrate and conductive portion. The key includes a key body and a connection wall which encloses a receiving space. The support component is disposed in the receiving space and includes a body, conical wall, buffering space, and extending pad connected to the conical wall. The body abuts against the key body. The conductive portion is disposed at the bottom of the body and inside the buffering space. The substrate is connected to the fixing pad and has thereon a circuit unit and a sensing layer. The substrate is coated with an insulating layer which covers the sensing layer. When the key body is pressed to press against the support component, electrostatic changes occur because of changes in the distance between the conductive portion and the sensing layer; hence, the circuit unit sends electrical signals for driving electronic apparatuses.

10 Claims, 8 Drawing Sheets

(56) References Cited

U.S. PATENT DOCUMENTS

| | | | | |
|---|---|---|---|---|
| 8,912,930 B2* | 12/2014 | Hu | G06F 3/0202 | 178/18.01 |
| 2004/0206615 A1* | 10/2004 | Aisenbrey | H01H 13/702 | 200/262 |
| 2005/0257628 A1* | 11/2005 | Nikaido | B60N 2/002 | 73/862.541 |
| 2006/0232559 A1* | 10/2006 | Chien | G06F 3/044 | 345/168 |
| 2006/0278444 A1* | 12/2006 | Binstead | G06F 3/044 | 178/18.06 |
| 2008/0094232 A1* | 4/2008 | Yokote | G06F 1/1616 | 340/604 |
| 2009/0135142 A1* | 5/2009 | Fu | G06F 3/016 | 345/168 |
| 2009/0135150 A1* | 5/2009 | Takashima | G06F 3/041 | 345/173 |
| 2009/0153502 A1* | 6/2009 | Jiang | G06F 3/0412 | 345/173 |
| 2010/0052880 A1* | 3/2010 | Laitinen | G06F 3/016 | 340/407.2 |
| 2010/0309130 A1* | 12/2010 | Zhao | H03K 17/9622 | 345/168 |
| 2011/0024275 A1* | 2/2011 | Aisenbrey | B29C 45/0013 | 200/262 |
| 2011/0043227 A1* | 2/2011 | Pance | G06F 1/1616 | 324/681 |
| 2011/0095877 A1* | 4/2011 | Casparian | G06F 3/016 | 340/407.2 |
| 2011/0102326 A1* | 5/2011 | Casparian | G06F 3/016 | 345/168 |
| 2012/0299864 A1* | 11/2012 | Tong | G06F 3/044 | 345/174 |
| 2013/0038542 A1* | 2/2013 | Kim | G06F 3/041 | 345/173 |
| 2013/0207924 A1* | 8/2013 | Mohindra | G06F 3/044 | 345/174 |
| 2013/0207931 A1* | 8/2013 | Shigetaka | G06F 3/044 | 345/174 |
| 2014/0097857 A1* | 4/2014 | Hu | G06F 3/044 | 324/661 |
| 2014/0097885 A1* | 4/2014 | Hu | G06F 3/044 | 327/517 |
| 2015/0116115 A1* | 4/2015 | Barrowman | G08B 21/18 | 340/540 |
| 2015/0301640 A1* | 10/2015 | Tsurusaki | G06F 3/041 | 345/175 |

* cited by examiner

CAPACITIVE SENSITIVE KEY STRUCTURE

CROSS-REFERENCE TO RELATED APPLICATION

This application is a continuation-in-part of U.S. patent application Ser. No. 14/827,283 filed Aug. 15, 2015. The above application is incorporated by reference herein.

BACKGROUND OF THE INVENTION

1. Technical Field

The present invention relates to a key and more particularly to a capacitive sensitive key structure which uses capacitive sensing of electrostatic changes and provides a sense of touch feedback.

2. Description of Related Art

Conventional keys are mostly mechanical and each comprises a cap, a key portion and a circuit board. The circuit board is disposed beneath the key portion. The cap fits around the key portion. The key portion has therein a resilient component and a sensing component. A metal layer is disposed on the circuit board and corresponds in position to the key portion. The resilient component deforms as soon as the key portion is pressed, so as to move the key portion downward and drive the sensing component to come into direct contact with the metal layer on the circuit board, thereby enabling the key portion to electrically connect with the circuit board and turn on. The circuit board generates an electrical signal in accordance with the circuit driven by the key portion to thereby turn on or control a tool or an electronic product, wherein the displacement of the key portion provides a sense of touch feedback to the pressing finger. However, the key portion of the conventional mechanical key and the surface of the circuit board or keyboard casing are separated by a gap. As a result, external moisture is likely to intrude into the key portion and the circuit board through the gap. For this reason, the metal layer on the circuit board is likely to be oxidized and damaged, thereby compromising or even precluding the electrical contact between the key portion and a contact terminal. Furthermore, the cap of the conventional mechanical key is made of a rigid material and thus is so brittle as to be susceptible to damage. However, due to the advancement of touch technology, touchscreens also function as touch keyboards. The touch surface of a conventional touch keyboard usually functions as the surface of a flat panel. External moisture is prevented from intruding into the panel, and electrical signal transmission begins with a touch given to the panel; however, touch keys nowadays cannot provide a segmental sense of touch feedback to the key portion of a key. As a result, it is impossible to determine whether the required key is correctly touched. Furthermore, since the key portions of the keys are not physically separated, the odds are that neighboring keys are wrongly touched to therefore cause erroneous control. Although it is feasible that the key of the touch panel may have a vibration component to provide after-touch vibration feedback, the vibration component adds to the manufacturing costs greatly, nor does it provide a solution to overcome the aforesaid drawbacks of the prior art, that is, failure to determine whether the required key is correctly touched, and a wrong touch arising from a lack of physical separation.

SUMMARY OF THE INVENTION

It is an objective of the present invention to provide a capacitive sensitive key structure which not only uses sensed electrostatic changes to drive a circuit and thus control an apparatus at an application end but also coats a circuit substrate with a raw material to protect and prevent the circuit substrate wiring and a sensing layer against oxidation.

Another objective of the present invention is to provide a capacitive sensitive key structure which provides a sense of touch feedback when a key is pressed and allows the key to move vertically or obliquely by a constant angle.

In order to achieve the above and other objectives, the present invention provides a capacitive sensitive key structure which comprises at least a key, a fixing pad, a substrate and a conductive portion. The key comprises a key body and a connection wall connected to the key body. The connection wall deforms when pressed against by the key body, thereby enabling the key body to move. The fixing pad is connected to the connection wall. A through hole is disposed at the fixing pad, corresponds in position to the key body and penetrates the fixing pad. The substrate is connected to one side of the fixing pad. A circuit unit and a sensing layer coupled to the circuit unit are disposed at the substrate and correspond in position to the through hole. The conductive portion is disposed between the bottom of the key body and the substrate and corresponds in position to the sensing layer from above. When the key body is pressed and moved to drive the conductive portion to move and separate from the sensing layer by a predetermined distance, electrostatic changes occur between the conductive portion and the sensing layer such that the circuit unit sends an electrical signal for driving a function of an electronic apparatus.

According to a preferred embodiment of the present invention, the substrate is coated with an insulating paint layer which at least covers the sensing layer.

According to a preferred embodiment of the present invention, the connection wall of encloses and defines a receiving space, and the key further comprises a support component disposed in the receiving space, a body, a conical wall extending from the body, a buffering space disposed inside of the conical wall, and an extending pad disposed at an end of the conical wall and attached to the substrate. The top surface of the body abuts against the bottom of the key body. The conductive portion is disposed on the bottom surface of the body and inside the buffering space.

According to another preferred embodiment of the present invention, the capacitive sensitive key structure further comprises at least a light-emitting component electrically connected to the substrate, and light rays emitted from the light-emitting component penetrate the key body thus are visible from outside.

The capacitive sensitive key structure of the present invention is characterized in that: the electrostatic field between a conductive portion made of conductive silicone and a sensing layer of the substrate changes such that a key body need not come into direct contact with the substrate in order to drive the circuit unit to generate an electrical signal; the substrate is coated with an insulating paint layer which prevents the sensing layer and the circuit unit from being oxidized and damaged; and, due to the conical wall of the support component, if a user presses any point of the top of the key, the key body will move vertically without moving obliquely by different angles. Hence, the capacitive sensitive key structure of the present invention is effective in overcoming drawbacks of the prior art, including: a conductive component of a conventional key must be in direct contact with a circuit board in order to be conductive, cannot be coated with a solder paint, and is likely to cause damage to circuits disposed on the circuit board; a conventional key fails to provide a sense of press feedback; and the conventional key cannot be accurately pressed, because it moves obliquely by different angles.

BRIEF DESCRIPTION OF THE SEVERAL
VIEWS OF THE DRAWINGS

DETAILED DESCRIPTION OF THE
EMBODIMENT OF THE INVENTION

Figure 1:
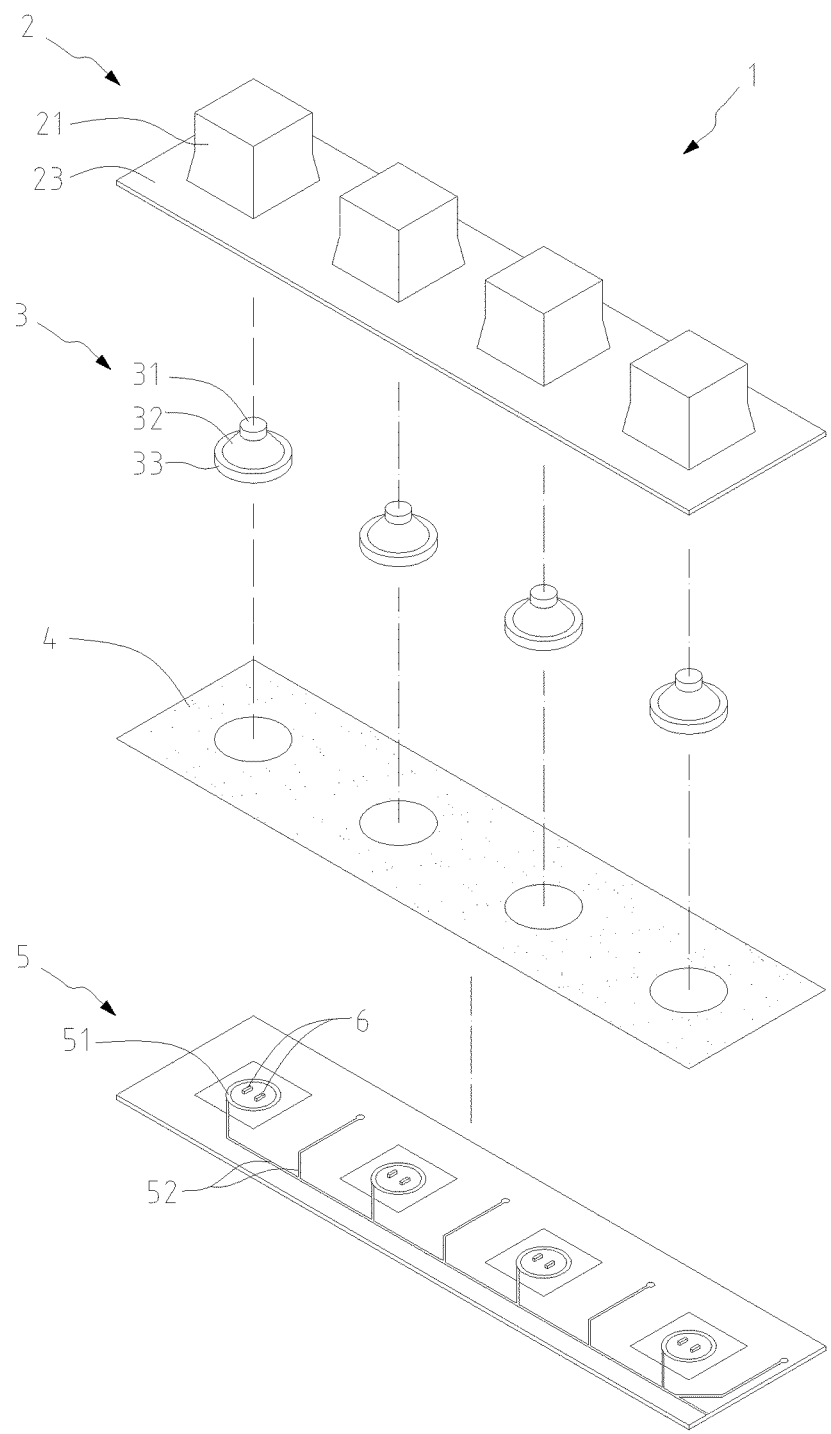
FIG. 1 is an exploded view of a capacitive sensitive key structure of the present invention.
Figure 2:
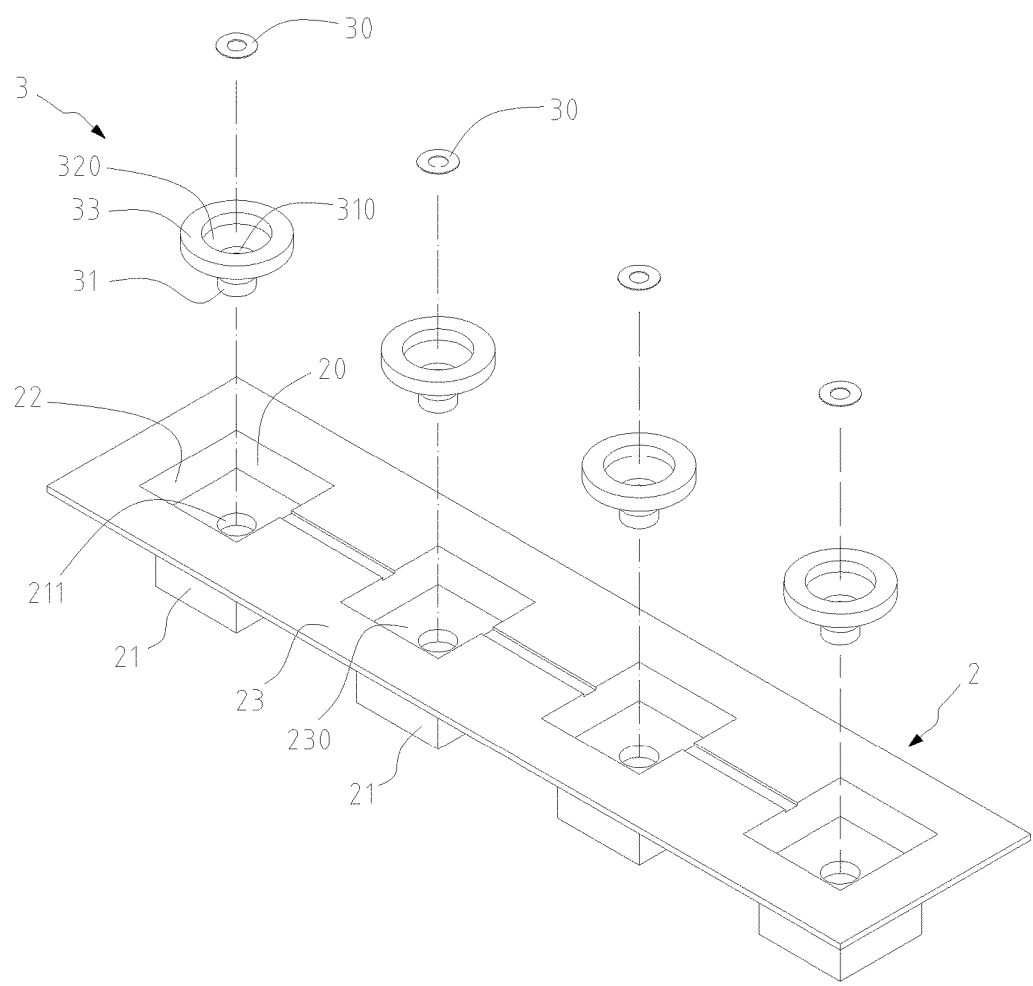
FIG. 2 is a partial exploded view of the capacitive sensitive key structure of the present invention when viewed from below.
Figure 3:
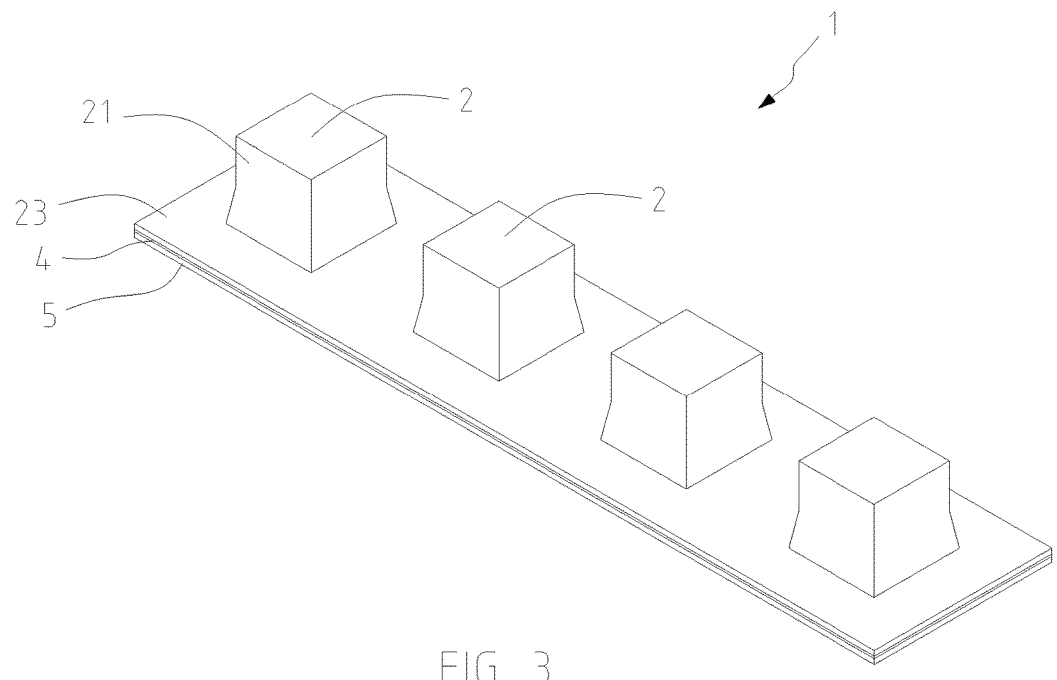
FIG. 3 is a perspective view of FIG. 1 when assembled.
Figure 4:
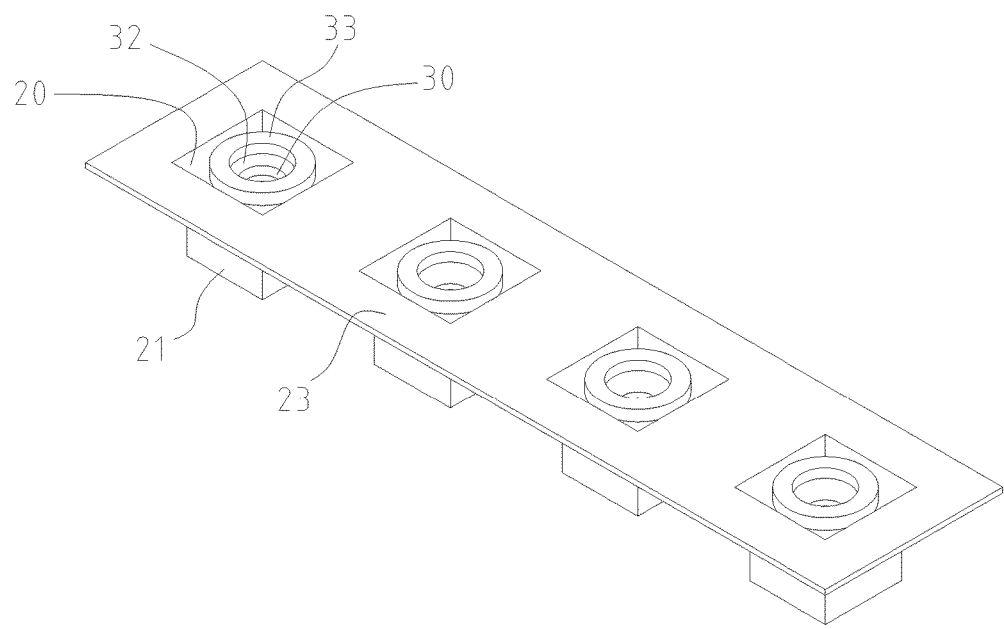
FIG. 4 is a perspective view of a key of the present invention when viewed from below.
Figure 5:
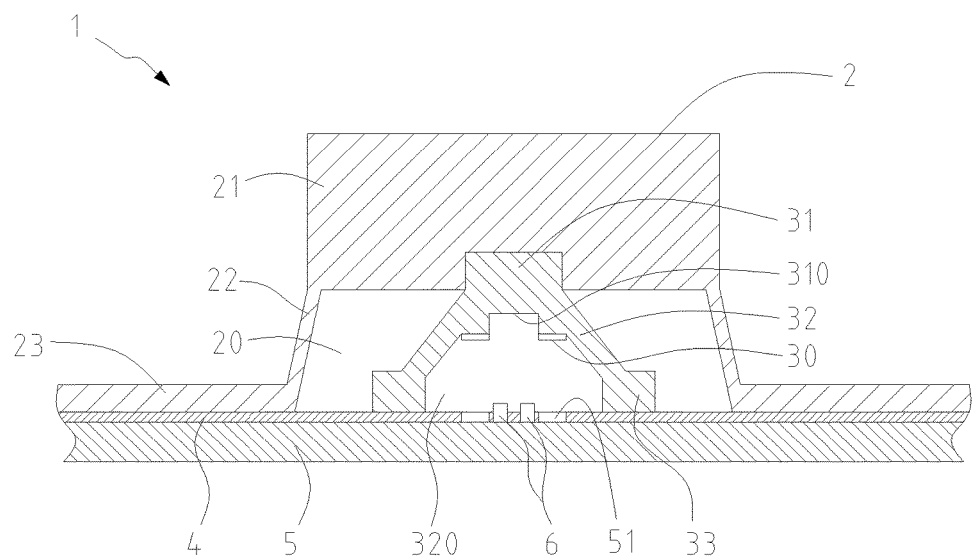
FIG. 5 is a cross-sectional view of the key of the present invention.

Referring to FIG. 1 through FIG. 6 regarding a capacitive sensitive key structure 1 according to a preferred embodiment of the present invention, the capacitive sensitive key structure 1 of the present invention is pressed to move downward and drive an electronic apparatus or a tool (not shown). The capacitive sensitive key structure 1 comprises at least a key 2, a support component 3, a fixing pad 23 and a substrate 5. In this embodiment, the capacitive sensitive key structure 1 comprises a plurality of keys 2 for controlling and performing various functions of the electronic apparatus. Each key 2 comprises a key body 21 and a connection wall 22 connected to the key body 21. The connection wall 22 is integrally formed with the fixing pad 23. The connection wall 22 encloses and defines a receiving space 20. The key body 21 has a substantially rectangular shape. A through hole 230 (shown in FIG. 2) is formed on the fixing pad 23, corresponds in position to the key body 21 and penetrates the fixing pad 23. In this embodiment, the fixing pads 23 of the plurality of keys 2 connect with each other integrally to allow the fixing pads 23 to take on a plate-like shape integrally. The plate-like fixing pads 23 are flatly fixed and sealingly attached to the substrate 5 to avoid external moisture intruding into the receiving space 20 (as shown in FIG. 3). A circuit unit 52 and a sensing layer 51 (shown in FIG. 1) are disposed at the substrate 5 and correspond in position to the through hole 230. The sensing layer 51 is coupled to the circuit unit 52 and corresponds in position a conductive portion 30. The circuit unit 52 comprises a plurality of integrated circuits each pre-configured with circuit layout dedicated to the function of a corresponding one of the keys 2.

As shown in FIGS. 1 and 2, both the key body 21 and the connection wall 22 are made of rubber. The key body 21 is solid and has a thickness. A positioning recess 211 is disposed centrally at the bottom of the key body 21 and communicates with the receiving space 20. The receiving space 20 is enclosed by the connection wall 22 such that external moisture cannot intrude into the keys 2. The receiving space 20 of the key body 21 receives the support component 3 which supports the key body 21. The connection wall 22 of the key body 21 connects with the key body 21 and the fixing pads 23. The key body 21 mainly receives support from the support component 3 instead of the connection wall 22 (shown in FIG. 5). The support component 3 comprises a body 31, a conical wall 32 extending from the body 31, a buffering space 320 formed inside the conical wall 32, and an extending pad 33 disposed at the bottom end of the conical wall 32. The extending pad 33 extends outward from the conical wall 32 to attach to the substrate 5; hence, the support component 3 has access to a large touch area on the substrate 5 for the sake of fixation, wherein the bottom surface of the extending pad 33 is flush with the bottom surface of the fixing pad 23. The top of the body 31 is inserted into and fixed to the positioning recess 211 of the key body 21 to thereby fix the support component 3 to the substrate 5 through the key body 21. Since the body 31 abuts against the center of the bottom of the key body 21, any force exerted upon any point on the top surface of the key body 21 can be uniformly transmitted to the body 31. Furthermore, a conductive portion 30 is disposed on the bottom surface of the body 31 and inside the buffering space 320. The conductive portion 30 is an annular plate and is made of conductive silicone. The conical wall 32 extends radially from the body 31 toward the substrate 5. The height of the connection wall 22 of the key body 21 is equal to or larger than the height of the conical wall 32 to provide sufficient space for holding the support component 3. The connection wall 22 extends outward and obliquely to the fixing pads 23; the inclination assures the structural integrity of the connection wall 22 being pressed and deformed (to be described later) and thus prolongs the service life of the connection wall 22.

Figure 6:
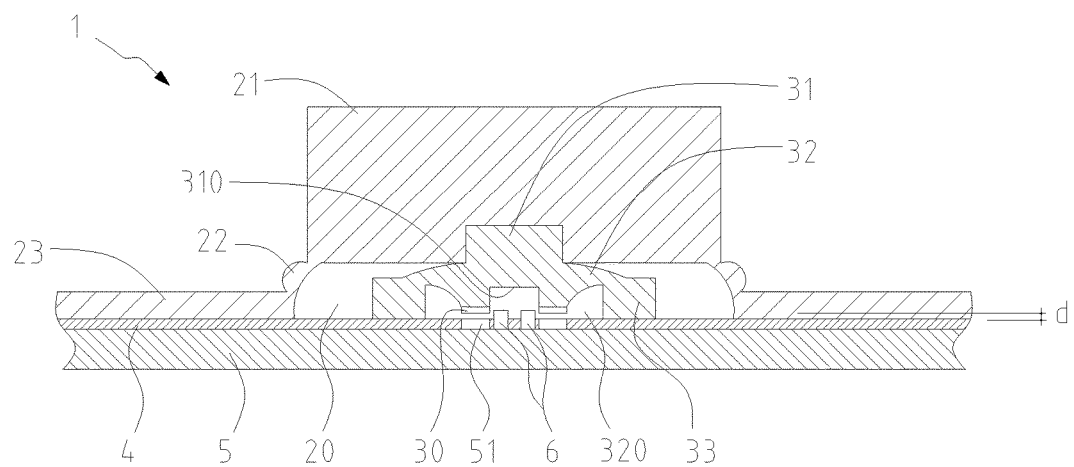
FIG. 6 is a cross-sectional view illustrative of the operation of the key of FIG. 5.

In a preferred embodiment, a portion of the substrate 5 corresponds in position to the through hole 230 and is electrically connected to two light-emitting components 6 which are light-emitting diodes. In this preferred embodiment, the light-emitting components 6 are enclosed by an annular sensing layer 51 corresponding in position to the annular the conductive portion 30 at the bottom of the body 31 of the support component 3 (as shown in FIG. 6). A recess 310 is disposed at the bottom of the body 31 and enclosed by the annular conductive portion 30. The recess 310 receives and conceals the light-emitting components 6 while the body 31 is moving. When the body 31 is pressed by the key body 21 to move downward, the recess 310 conceals the light-emitting components 6 to thereby reduce the total required thickness of the support component 3 for evading the light-emitting components 6. In this embodiment, the support component 3, the key body 21 and the connection wall 22 are transparent such that light rays emitted from the light-emitting components 6 can penetrate the key body 21 and thus are visible from outside for the sake of external identification. The light-emitting components 6 are configured to emit light as soon as electrical current passes the substrate 5. Alternatively, the light-emitting components 6 are configured to emit light as soon as the key is pressed to cause the circuit unit 52 to generate an electrical signal.

Before the body 31 is pressed against, a distance by which the bottom surface of the conductive portion 30 and the sensing layer 51 are separated is larger than 1.5 mm. The distance depends on the structure height of the support component 3. The substrate 5 is coated with an insulating paint layer 4 which fully covers the sensing layer 51 and the circuit unit 52. The insulating paint layer 4 is capable of insulation. The metal sensing layer 51 is coated with the insulating paint layer 4 to prevent the metal sensing layer 51 against oxidation and thus problems with electrical conduction. Furthermore, the insulating paint layer 4 protects the substrate 5 and the sensing layer 51 and thus prevents any foreign body from coming into direct contact with the surface of the substrate 5.

Given the aforesaid structure, the capacitive sensitive key structure 1 of the present invention operates in a manner described below. A user uses a finger to press the top of the key body 21. With the key body 21 being pressed, the connection wall 22 bends and deforms to not only cause the key body 21 to move downward but also press against the body 31 of the support component 3. As a result, the conical wall 32 deforms to thereby cause the body 31 to move downward; meanwhile, the distance between the annular the conductive portion 30 and the sensing layer 51 of the substrate 5 changes. When the distance changes to a predetermined distance d (as shown in FIG. 6), that is, less than 0.5 mm, the capacitance between the conductive portion 30 and the sensing layer 51 changes. The capacitance change is accompanied by an electrostatic field change, and thus the circuit unit 52 of the substrate 5 generates and sends an electrical signal to an electronic apparatus placed under control so as to drive and perform the functions of the electronic apparatus. Hence, the key 2 triggers the circuit unit 52 to send an electrical signal as soon as the distance between the conductive portion 30 and the sensing layer 51 changes to a predetermined distance d, that is, less than 0.5 mm.

As indicated by the above description, the capacitive sensitive key structure 1 of the present invention uses the conical wall 32 of the support component 3 as the major structure which bears a force and deforms. The circular peripheral surface of the conical wall 32 is of a constant curvature; hence, when subjected to a force, the conical wall 32 deforms uniformly to thereby ensure that the key body 21 can move vertically, thereby precluding press feedback resulting from unequal angles of inclination of the key body 21.

Referring to FIG. 7 through FIG. 12 regarding the capacitive sensitive key structure 1 according to the second embodiment of the present invention, the second embodiment differs from the first embodiment in that the second embodiment dispenses with the support component 3. In the second embodiment, the capacitive sensitive key structure 1 comprises a key 2, fixing pad 23, the conductive portion 30, the substrate 5 and platform 24. The connection wall 22 of the key body 21 is integrally formed with the bottom of the key body 21, extends from the bottom of the key body 21 outwardly and obliquely to the through hole 230, and is integrally formed with the fixing pad 23; hence, the connection wall 22 encloses the bottom of the key body 21. The second embodiment differs from the first embodiment in the position of the conductive portion 30. In the second embodiment, the conductive portion 30 is disposed on one side of the key body 21 and corresponds in position to the substrate 5. The conductive portion 30 comprises a plurality of spaced-apart conductive silicone plates. The sensing layer 51 corresponds in position to the conductive portion 30.

Referring to FIG. 1 through FIG. 11, in the second embodiment, the key 2 is structured in a manner to achieve specific functions. The key body 21 is a six-sided solid and each of its two opposing sides has a platform 24 which extends outward from a point lower than the middle of the side of the key body 21 to thereby form a curved surface 241 from the corner opposite the side. Hence, the angles of the four corners at the junctions of the four sides of the six-sided key body 21 increase and thus reinforce the laterals structure of the key body 21 to thereby prevent the key body 21 from moving because of uncoordinated angular changes of the key body 21 which occur as soon as the top of the key body 21 is pressed. Therefore, if the six-sided key body 21 had not been designed to have the platform 24, the key body 21 would have tended to sink obliquely by different angles as soon as the corners of the key body 21 were pressed against, and in consequence the press feedback of the key 2 would be inaccurate. By contrast, when the key body 21 is pressed against, the lateral structures of the platform 24 transmit the pressing force to the platform 24 to thereby prevent the key 2 from moving because of angular changes, so as to provide a sense of press feedback to the user's hand. Furthermore, a limiting element 242 is disposed on the four edges of the bottom of the key body 21. The limiting elements 242 are of a smaller thickness than the conductive portion 30. The limiting elements 242 are disposed between the conductive portion 30 and the connection wall 22. When the margin of the key body 21 is pressed against continuously, the limiting elements 242 abut against the substrate 5 to not only prevent the key body 21 from being overly deformed when overly pressed, but also protect the conductive portion 30 against damage which might otherwise happen when the conductive portion 30 is overly pressed.

Figure 8:
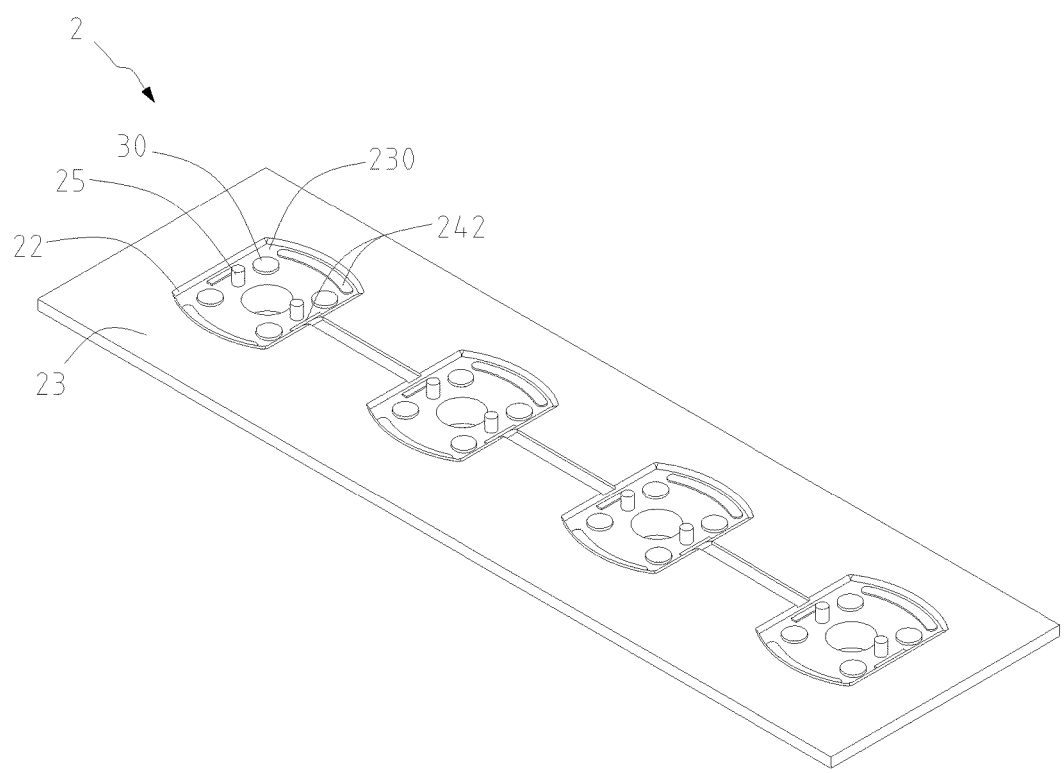
FIG. 8 is a perspective view of the key of FIG. 7 when viewed from below.
Figure 9:
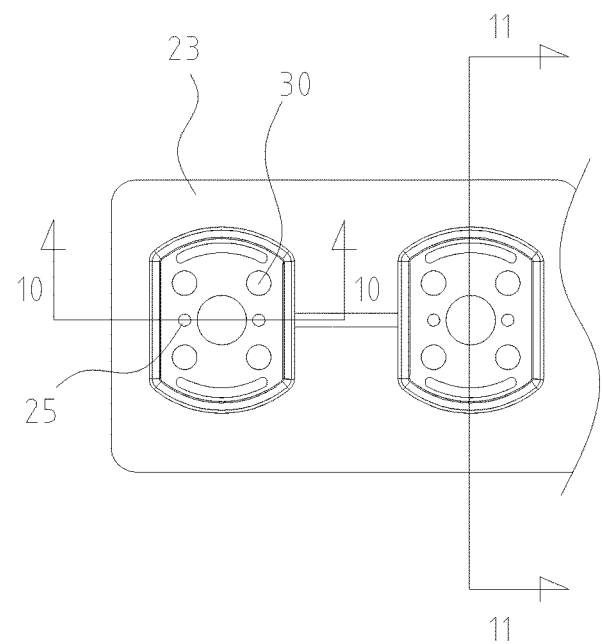
FIG. 9 is a top schematic view of FIG. 8.
Figure 10:
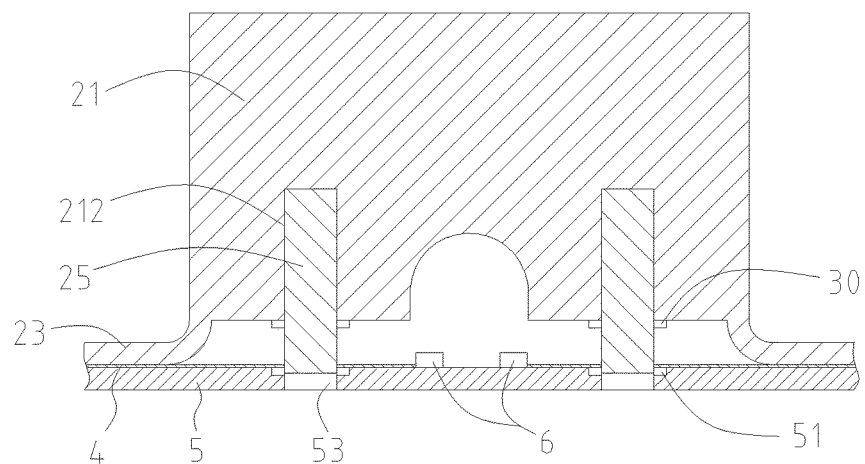
FIG. 10 is a cross-sectional view taken along line 10-10 of FIG. 9.
Figure 11:
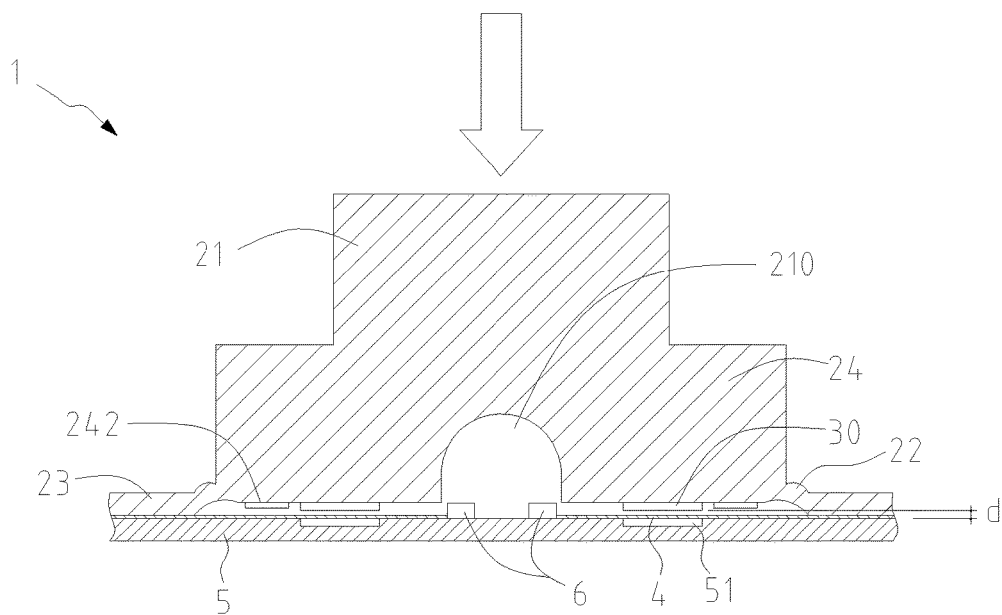
FIG. 11 is a cross-sectional view taken along line 11-11 of FIG. 9.

Referring to FIG. 8 and FIG. 10, a fixing hole 212 is disposed on each of the two opposing edges of the bottom of the key body 21 and between the conductive portions 30 spaced apart. A positioning post 25 is inserted into a corresponding one of the fixing holes 212 and extends outward from the bottom of the key body 21. A positioning channel 53 is disposed at the substrate 5 and corresponds in position to a corresponding one of the positioning posts 25. Before the key body 21 is pressed against, the positioning posts 25 are inserted into portions of the positioning channels 53, respectively, to enable the positioning of the key body 21 and the substrate 5. The positioning posts 25 move into the positioning channels 53 as soon as the key body 21 is pressed to move, so as to not only achieve the positioning effect but also transmit the pressing force from the key body 21 to the substrate 5 and ensure that the key body 21 moves vertically.

Figure 7:
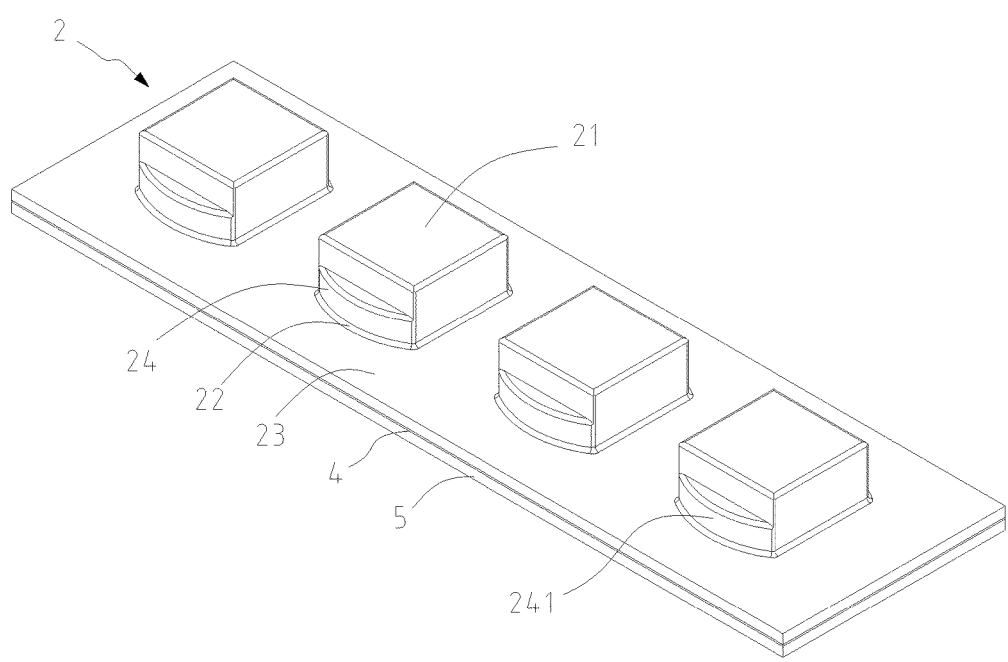
FIG. 7 is a perspective view of the capacitive sensitive key structure according to another embodiment of the present invention.

In the second embodiment, to operate the capacitive sensitive key structure 1, the user uses a finger to press the top of the key body 21, and then the pressing force is transmitted from the key body 21 to the platform 24 and eventually to the connection wall 22, thereby causing the connection wall 22 to deform and thus drive the key body 21 to move downward; meanwhile, the distance between the conductive portion 30 comprising a plurality of plates and the sensing layer 51 of the substrate 5 changes. The capacitance between the conductive portion 30 and the sensing layer 51 changes and thus the electrostatic field changes as soon as the distance reaches a predetermined distance d (as shown in FIG. 7), that is, less than 0.5 mm, such that the circuit unit 52 of the substrate 5 generates and sends an electrical signal to an electronic apparatus placed under control, so as to drive and perform the function of the electronic apparatus. The platforms 24 disposed on two opposing sides of the key body 21 increase the angles of the four corners of the four connected sides of the connection wall 22 to thereby preclude unequal angular change and deformation of the key body 21 being pressed. The limiting elements 242 preclude angular change and deformation of the key body 21 being pressed. The positioning posts 25 not only enable further positioning but also ensures that the key body 21 moves vertically when the key body 21 is pressed.

Figure 12:
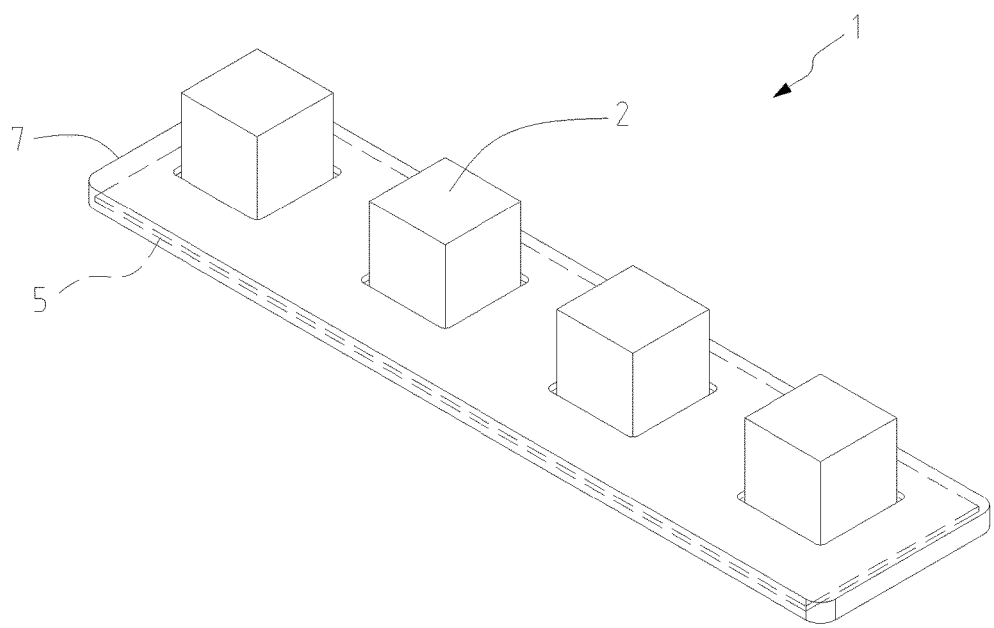
FIG. 12 is a schematic view of the capacitive sensitive key structure according to a preferred embodiment of the present invention.

Referring to FIG. 12, the fixing pad 23 of the capacitive sensitive key structure 1 of the present invention is covered with a panel 7 for further protecting the substrate 5.

Accordingly, the capacitive sensitive key structure 1 of the present invention has advantages described below. Due to electrostatic changes between the conductive portion 30 made of conductive silicone and the sensing layer 51 of the substrate 5, the key body 21 drives the circuit unit 52 to generate an electrical signal without coming into direct contact with the substrate 5. The substrate 5 is coated with the insulating paint layer 4 whereby the sensing layer 51 and the circuit unit 52 are prevented from getting oxidized and damaged. Due to the conical wall 32 of the support component 3, if the user presses any point of the top of the key 2, the key body 21 will move vertically without moving obliquely by different angles. Hence, the capacitive sensitive key structure 1 of the present invention is effective in overcoming drawbacks of the prior art, including: a conductive component of a conventional key must be in direct contact with a circuit board in order to be conductive, cannot be coated with a solder paint, and is likely to cause damage to circuits disposed on the circuit board; a conventional key fails to provide a sense of press feedback; and the conventional key cannot be accurately pressed, because it moves obliquely by different angles.

It is understood that the invention may be embodied in other forms within the scope of the claims. Thus the present examples and embodiments are to be considered in all respects as illustrative, and not restrictive, of the invention defined by the claims.

What is claimed is:

1. A capacitive sensitive key structure, comprising:
   at least a key comprising a key body and a connection wall connected to the key body and adapted to deform when pressed against by the key body, thereby enabling the key body to move;
   a fixing pad connected to the connection wall, wherein a through hole is disposed at the fixing pad, corresponds in position to the key body and penetrates the fixing pad;
   a substrate connected to a side of the fixing pad, wherein a circuit unit and a sensing layer coupled to the circuit unit are disposed at the substrate and correspond in position to the through hole; and
   a conductive portion disposed between a bottom of the key body and the substrate and corresponding in position to the sensing layer from above, wherein, when the key body is pressed and moved to drive the conductive portion to move and separate from the sensing layer by a predetermined distance, electrostatic changes occur between the conductive portion and the sensing layer such that the circuit unit sends an electrical signal for driving a function of an electronic apparatus;
   wherein the connection wall encloses and defines a receiving space and is integrally formed with the fixing pad, the fixing pad sealingly attached to the substrate to avoid external moisture intruding into the receiving space, and the key further comprising a support component sealingly disposed in the receiving space, the support component comprising a body, a conical wall extending from the body, a buffering space disposed inside of the conical wall, and an extending pad disposed at an end of the conical wall and attached to the substrate, wherein a top surface of the body abuts against the bottom of the key body, and the conductive portion is disposed on a bottom surface of the body and inside the buffering space.

2. The capacitive sensitive key structure of claim 1, wherein the substrate is coated with an insulating paint layer which at least covers the sensing layer.

3. The capacitive sensitive key structure of claim 1, wherein a height of the connection wall is less than a height of the conical wall such that the conical wall deforms as soon as the key body presses against the support component, thereby enabling the body to move toward the substrate.

4. The capacitive sensitive key structure of claim 1, wherein a positioning recess is disposed at the bottom of the key body such that an end of a body of the support component is inserted into and fixed to the positioning recess, wherein the conical wall extends radially from the body toward the substrate.

5. The capacitive sensitive key structure of claim 1, wherein a bottom surface of the fixing pad is flush with a bottom surface of the extending pad of the conical wall.

6. The capacitive sensitive key structure of claim 1, further comprising at least a light-emitting component electrically connected to the substrate and disposed inside the buffering space of the support component, wherein light rays emitted from the at least a light-emitting component penetrate the key body and the support component and thus are visible from outside.

7. The capacitive sensitive key structure of claim 6, wherein a recess is disposed at a bottom of a body of the support component and corresponds in position to the at least a light-emitting component to thereby receive and conceal the at least a light-emitting component while the body is moving.

8. The capacitive sensitive key structure of claim 1, wherein the predetermined distance by which the conductive portion and the sensing layer are separated is less than 0.5 mm.

9. The capacitive sensitive key structure of claim 1, wherein at least two opposing sides of the key body have platforms; respectively, extending outward from opposite corners of the side of the key body to thereby form a curved surface for preventing the key body from moving because of uncoordinated angular changes of the key body which occur as soon as the key body is pressed.

10. The capacitive sensitive key structure of claim 1, wherein at least a limiting element is disposed at a periphery of the bottom of the key body and of a smaller thickness than the conductive portion such that, when a margin of the key body is pressed continuously, the limiting element abuts against the substrate to thereby prevent the key body from being overly pressed and thus overly deformed.

* * * * *